(12) United States Patent
Kim et al.

(10) Patent No.: US 11,785,796 B2
(45) Date of Patent: Oct. 10, 2023

(54) DISPLAY DEVICE INCLUDING MULTI-PORTION BARRIER LAYER

(71) Applicant: Samsung Display Co., Ltd., Yongin-si (KR)

(72) Inventors: Min-Sung Kim, Hwaseong-si (KR); Hyoyul Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 173 days.

(21) Appl. No.: 17/218,057

(22) Filed: Mar. 30, 2021

(65) Prior Publication Data

US 2021/0399259 A1    Dec. 23, 2021

(30) Foreign Application Priority Data

Jun. 22, 2020  (KR) ......................... 10-2020-0075724

(51) Int. Cl.
*H01L 51/00*     (2006.01)
*H01L 51/52*     (2006.01)
(Continued)

(52) U.S. Cl.
CPC .... *H01L 51/5253* (2013.01); *G02F 1/133305* (2013.01); *G02F 1/133331* (2021.01);
(Continued)

(58) Field of Classification Search
CPC ............. H01L 51/5253; H01L 51/0097; H01L 51/5237; H01L 51/5246; H01L 51/5293; H01L 2251/5338; H01L 27/323; H01L 27/14678; H01L 27/322; H01L 27/3211; G02F 1/133305; G02F 1/133331; G02F 1/133528; G02F 1/133512; G02F 1/136209; G06F 1/1616; G06F 1/1643; G06F 1/1652; G06F 1/1656; G06F 1/1681; G06F 1/1641; G06F 9/301
See application file for complete search history.

(56) References Cited

U.S. PATENT DOCUMENTS 10,032,806 B2   7/2018  Seo et al.
10,164,208 B2   12/2018 Lee et al.
(Continued)

FOREIGN PATENT DOCUMENTS

| KR | 20160069836 | 6/2016 |
| KR | 20170093308 | 8/2017 |
| KR | 20180079091 | 7/2018 |
| KR | 20190041252 | 4/2019 |

*Primary Examiner* — Ida M Soward
(74) *Attorney, Agent, or Firm* — H.C. Park & Associates, PLC

(57) ABSTRACT

A display device includes: a display module having a first non-foldable region, a second non-foldable region, and a foldable region disposed between the first non-foldable region and the second non-foldable region and being foldable about a folding axis extending in a first direction; and a barrier layer disposed adjacent the display module and including: a first portion having a first region overlapping the first non-foldable region, a second region overlapping the foldable region, and a third region overlapping the second non-foldable region; and a second portion extending from at least a portion of the second region of the first portion in the first direction.

20 Claims, 16 Drawing Sheets

(51) Int. Cl.
*H01L 27/14* (2006.01)
*H01L 27/32* (2006.01)
*G02F 1/13* (2006.01)
*G06F 1/16* (2006.01)
*G09F 9/30* (2006.01)
*G02F 1/1333* (2006.01)
*H01L 27/146* (2006.01)
*G02F 1/1335* (2006.01)
*G02F 1/1362* (2006.01)

(52) U.S. Cl.
CPC .. *G02F 1/133512* (2013.01); *G02F 1/133528* (2013.01); *G02F 1/136209* (2013.01); *G06F 1/1641* (2013.01); *G06F 1/1652* (2013.01); *H01L 27/14678* (2013.01); *H01L 27/322* (2013.01); *H01L 27/323* (2013.01); *H01L 27/3211* (2013.01); *H01L 51/5246* (2013.01); *H01L 51/5293* (2013.01)

(56) References Cited

U.S. PATENT DOCUMENTS

| | | | |
|---|---|---|---|
| 10,212,811 B1* | 2/2019 | Zhang | H01L 51/0097 |
| 10,461,274 B2 | 10/2019 | Kim | |
| 10,714,562 B2 | 7/2020 | Yang et al. | |
| 2017/0278900 A1* | 9/2017 | Yang | H01L 27/3272 |
| 2019/0086709 A1* | 3/2019 | Lee | G06F 1/1643 |
| 2019/0107866 A1* | 4/2019 | Han | G06F 3/047 |
| 2019/0143638 A1* | 5/2019 | Park | B32B 7/025 |
| | | | 361/820 |
| 2019/0189035 A1* | 6/2019 | Ochi | H01L 51/0097 |
| 2020/0105168 A1* | 4/2020 | Choi | G06F 1/1656 |
| 2020/0251679 A1* | 8/2020 | Ha | H01L 27/323 |
| 2020/0266368 A1* | 8/2020 | Park | H01L 51/5281 |
| 2020/0294428 A1 | 9/2020 | Kim et al. | |
| 2020/0301474 A1* | 9/2020 | Yug | B32B 1/00 |
| 2020/0363676 A1* | 11/2020 | Eguchi | H01L 29/78603 |
| 2021/0013237 A1* | 1/2021 | Ke | H01L 51/5253 |
| 2021/0041601 A1* | 2/2021 | Oh | B32B 27/08 |
| 2021/0168929 A1* | 6/2021 | Wang | G06F 1/1652 |
| 2022/0149313 A1* | 5/2022 | Nakamura | H01L 51/50 |

* cited by examiner

DISPLAY DEVICE INCLUDING MULTI-PORTION BARRIER LAYER

CROSS-REFERENCE TO RELATED APPLICATION

This application claims priority from and the benefit of Korean Patent Application No. 10-2020-0075724, filed on Jun. 22, 2020, which is hereby incorporated by reference for all purposes as if fully set forth herein.

BACKGROUND

Field

Exemplary embodiments of the invention relate generally to a display device, and more particularly, to a flexible display device.

Discussion of the Background

Display devices display various images on display screens and provide users with information. In general, display devices display information within assigned screen. Recently, flexible display devices including foldable flexible display panels have been developed. Flexible display devices may be foldable, rollable, or bendable unlike rigid display devices. Flexible display devices, which may have a variety of shapes, are portable regardless of existing screen size and thus may have improved user convenience.

The above information disclosed in this Background section is only for understanding of the background of the inventive concepts, and, therefore, it may contain information that does not constitute prior art.

SUMMARY

Applicant realized that certain layers in foldable display device may become cracked or damaged due to repeated folding and unfolding, thereby adversely affecting product reliability or performance and/or permitting contaminants such as dirt and moisture, into the display module.

Display devices constructed according to the principles and exemplary implementations of the invention has improved product reliability. For example, the display device may include a display module and a barrier layer disposed under the display module. The barrier layer may include a first portion and a second portion protruding from a part of the first portion which overlaps a foldable region of the display module. The second portion may reduce stress applied to the first portion and/or the barrier layer when the display device is folded. Accordingly, it is possible to prevent a crack from occurring in the first portion and/or the barrier layer, and the barrier layer and/or the display device may have improved reliability and life span. Also, the barrier layer may prevent foreign substances from infiltrating into the display module, which may further improve the life span of the display module and/or the display device.

Additional features of the inventive concepts will be set forth in the description which follows, and in part will be apparent from the description, or may be learned by practice of the inventive concepts.

According to one aspect of the invention, a display device includes: a display module having a first non-foldable region, a second non-foldable region, and a foldable region disposed between the first non-foldable region and the second non-foldable region and being foldable about a folding axis extending in a first direction; and a barrier layer disposed adjacent the display module and including: a first portion having a first region overlapping the first non-foldable region, a second region overlapping the foldable region, and a third region overlapping the second non-foldable region; and a second portion extending from at least a portion of the second region of the first portion in the first direction.

The barrier layer may be foldable about a folding axis overlapping the second region such that the first region and the third region face each other.

The second portion may overlap the folding axis.

The second portion may include: a first sub portion overlapping the first region in the first direction; a second sub portion overlapping the second region in the first direction; and a third sub portion overlapping the third region in the first direction. The second sub portion overlaps the folding axis.

The barrier layer may include a barrier layer contains at least one of aluminum, copper, nickel, iron, or titanium.

The barrier layer may have a thickness in a range of about 10-50 μm inclusive.

The first portion may include a substantially flat portion, and the second portion includes a protruding portion, the first to third regions may be sequentially defined in the substantially flat portion in a second direction intersecting the first direction, and the protruding portion may extend from the substantially flat portion in the first direction.

The protruding portion may have a width in a range of about 3-10 mm inclusive in the second direction.

A length by which the protruding portion extends in the first direction from the substantially flat portion may be about 100-2,000 μm inclusive.

The second portion may include at least one shape of a semicircular shape or a generally rectangular shape.

The second portion may include: a first protruding portion extending from a first side of the first portion; and a second protruding portion extending from a second side of the first portion substantially parallel to the first side.

The display device may further include at least one of a cushion layer or a metal plate disposed adjacent the barrier layer.

According to another aspect of the invention, a display device includes: a display module having a first non-foldable region, a foldable region, and a second non-foldable region which are sequentially defined in a first direction; and a barrier layer disposed adjacent the display module and having a first region overlapping the first non-foldable region, a second region overlapping the foldable region, and a third region overlapping the second non-foldable region. The barrier layer includes a first portion overlapping the display module, and a second portion extending from the first portion in a second direction intersecting the first direction and at least partially overlapping the second region.

The barrier layer may include a barrier layer contains at least one of aluminum, nickel, copper, iron, or titanium.

The first non-foldable region, the foldable region, the second non-foldable region, and each of the first to third regions may extend in the second direction intersecting the first direction, and the display module may have a length greater than a length of the barrier layer in the second direction.

The second portion may be foldable about a folding axis extending in the second direction.

The second portion may include a protruding portion including: a first sub portion overlapping the first region; a second sub portion overlapping the second region; and a third sub portion overlapping the third region. The second sub portion overlaps the folding axis.

A length by which the second portion protrudes in the second direction from the first portion may be about 100-2,000 μm inclusive.

The barrier layer may have a thickness in a range of about 10-50 μm inclusive.

According to still another aspect of the invention, a display device includes: a substrate having a first substrate region, a second substrate region, and a third substrate region, the third substrate region being disposed between the first substrate region and the second substrate region and overlapping a folding axis; and a barrier layer disposed adjacent the substrate and including a first portion overlapping the first substrate region, a second portion overlapping the second substrate region, and a third portion overlapping the third substrate region. The first substrate region, the third substrate region, and the second substrate region are defined on the substrate in a first direction, the folding axis extends in a second direction intersecting the first direction, the barrier layer further includes a fourth portion extending in the second direction from at least one side of the third portion, and at least a portion of the fourth portion overlaps the second portion in the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
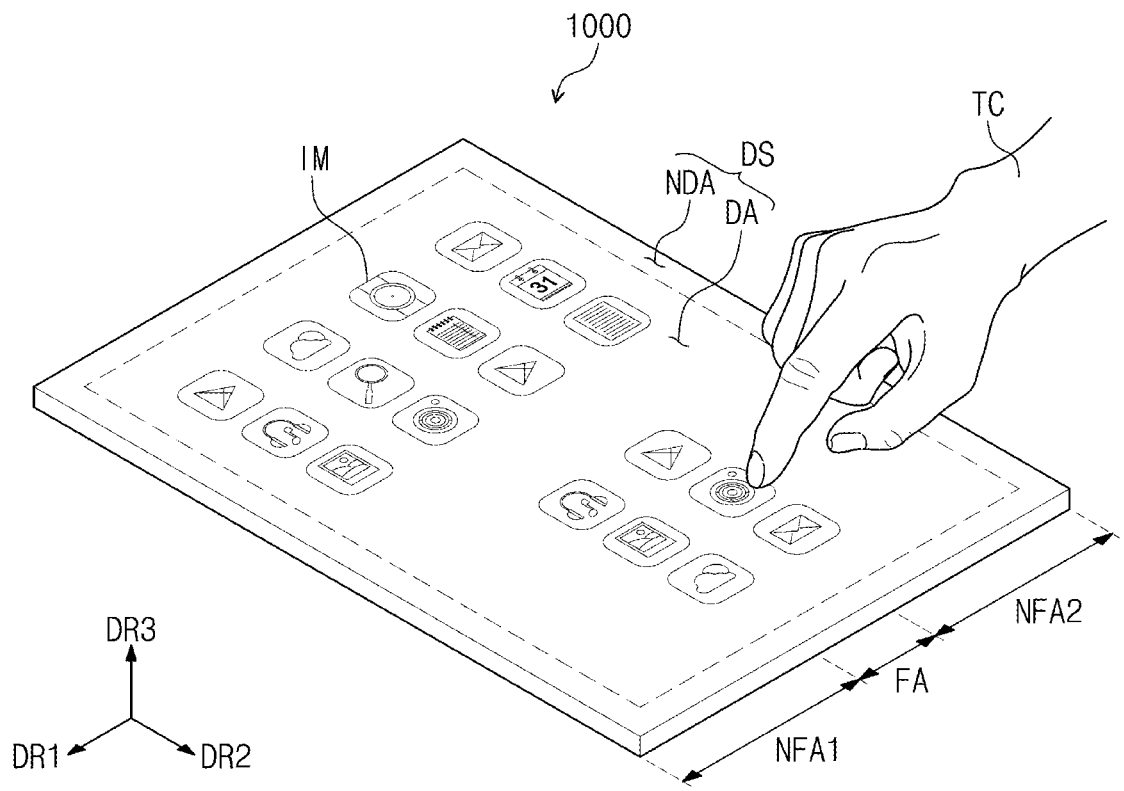
FIG. 1A is a perspective view of an exemplary embodiment of a display device.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
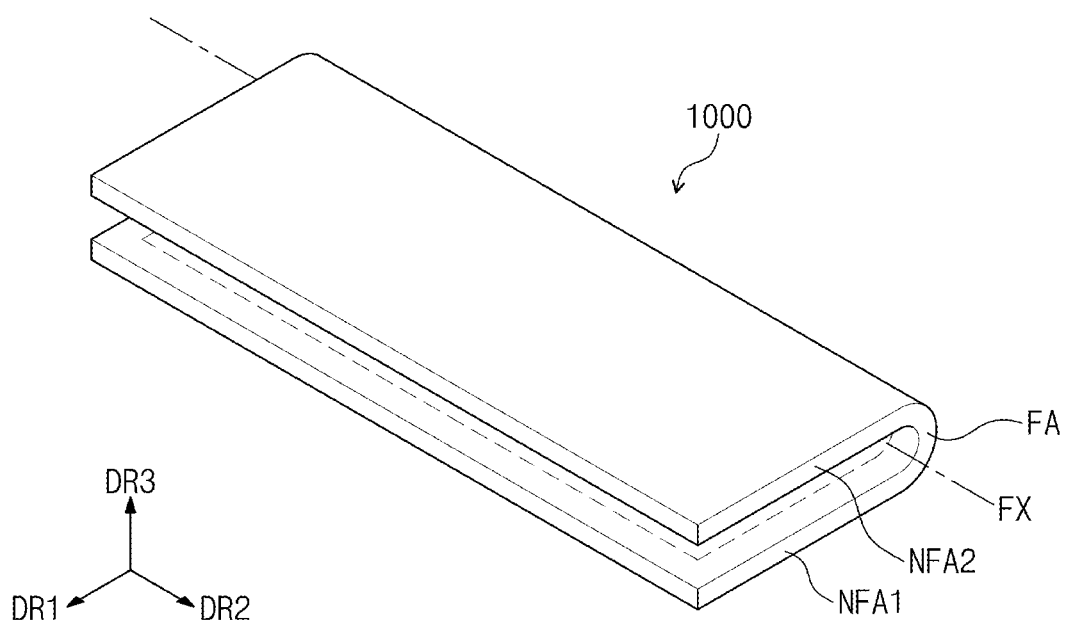
FIG. 1B is a perspective view of the display device of FIG. 1A in a folded position.

FIG. 1A is a perspective view of an exemplary embodiment of a display device. FIG. 1B is a perspective view of the display device of FIG. 1A in a folded position.

Referring to FIGS. 1A and 1B, a display device 1000 may be a foldable display device. The display device 1000 may be used for or implemented in a variety of electronic devices, including a large-sized electronic device such as a television and a monitor, and a small and medium-sized electronic device such as a mobile phone, a tablet, a vehicle navigation device, a game machine, or a smart watch.

The upper surface of the display device 1000 may be defined as a display surface DS, and in an unfolded position, the display surface DS may be substantially parallel to a plane defined by a first direction DR1 and a second direction DR2.

The display surface DS may include a display region DA and a non-display region NDA adjacent to the display region DA. The display region DA is a region on which an image IM is displayed and the non-display region NDA is a region on which an image IM is not displayed. FIG. 1 illustrates application icons as examples of the image IM.

The display region DA may have a generally rectangular shape. The non-display region NDA may surround the display region DA. However, exemplary embodiments are not limited thereto, and the shapes of the display region DA and the non-display region NDA may take various forms and be designed without any limitation.

In the display device 1000, a first non-foldable region NFA1, a foldable region FA, and a second non-foldable region NFA2 may be defined sequentially in the first direction DR1. That is, the foldable region FA may be defined between the first non-foldable region NFA1 and the second non-foldable region NFA2. FIGS. 1A and 1B illustrate a single foldable region FA and first and second non-foldable regions NFA1 and NFA2, but the numbers of the foldable region FA and the first and second non-foldable regions NFA1 and NFA2 are not limited thereto. For example, the display device 1000 may include two or more non-foldable regions and foldable regions disposed between the non-foldable regions.

The display device 1000 may be folded about a folding axis FX. That is, the foldable region FA may be bent and/or folded about the folding axis FX. The folding axis FX may extend in the second direction DR2. The folding axis FX may be defined as a longitudinal axis substantially parallel to longitudinally extending sides of the display device 1000.

When the display device 1000 is folded, the display surface of the first non-foldable region NFA1 and the display surface of the second non-foldable region NFA2 may face each other. Accordingly, the display surface DS may not be exposed to the outside in a folded position. However, this is merely an example, and exemplary embodiments are not limited thereto. In an exemplary embodiment, when the display device 1000 is folded, the display surface of the first non-foldable region NFA1 and the display surface of the second non-foldable region NFA2 may be opposite to each other. Accordingly, the display surface DS may also be exposed to the outside in a folded position.

Figure 2A:
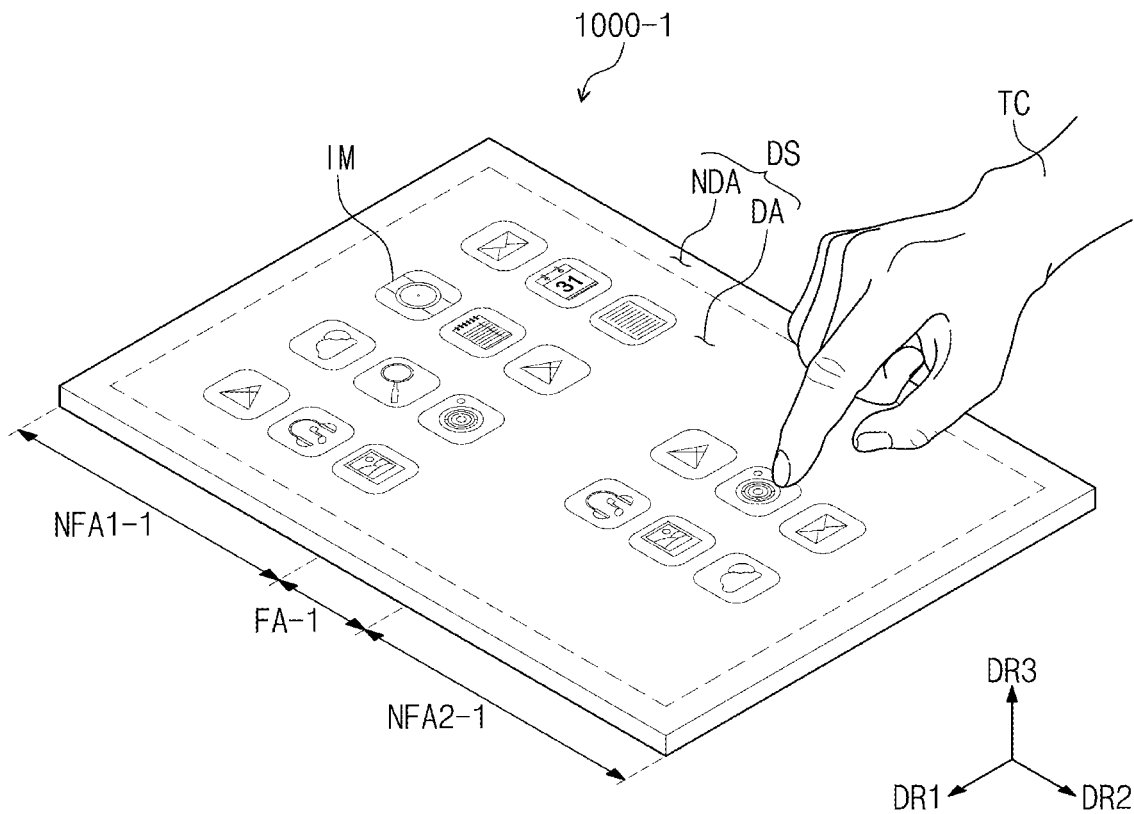
FIG. 2A is a perspective view of another exemplary embodiment of a display device.
Figure 2B:
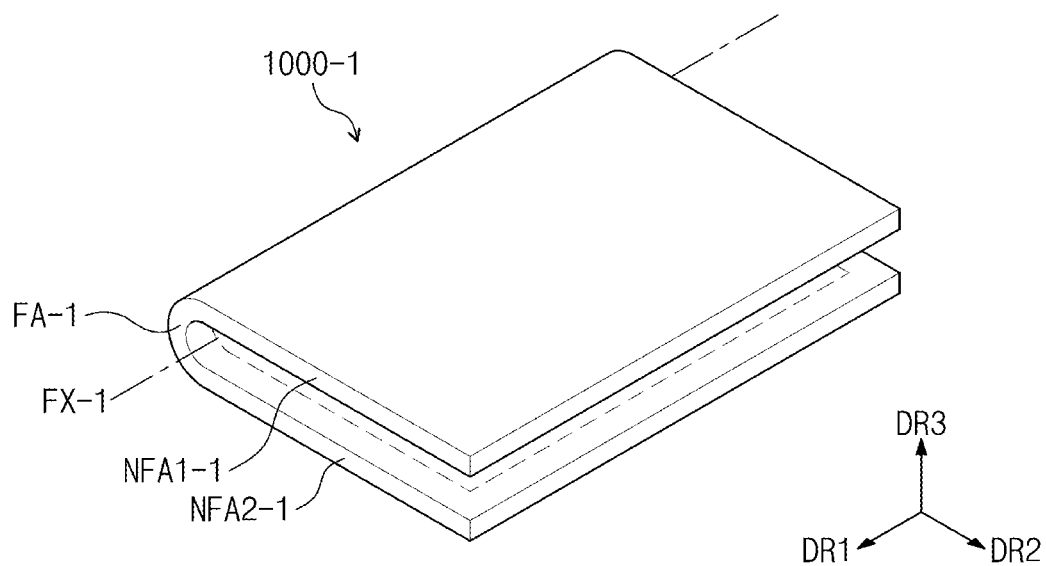
FIG. 2B is a perspective view of the display device of FIG. 2A in a folded position.

FIG. 2A is a perspective view of another exemplary embodiment of a display device. FIG. 2B is a perspective view of the display device of FIG. 2A in a folded position.

Referring to FIGS. 2A and 2B, a display device 1000-1 may include a first non-foldable region NFA1-1, a foldable region FA-1, and a second non-foldable region NFA2-1 defined sequentially in the second direction DR2. The foldable region FA-1 may be defined between the first non-foldable region NFA1-1 and the second non-foldable region NFA2-1.

The display device 1000-1 may be folded about a folding axis FX-1. That is, the foldable region FA-1 may be bent and/or folded about the folding axis FX-1. The folding axis FX-1 may extend in the first direction DR1. The folding axis FX-1 may be defined as a transverse axis substantially parallel to the short, transversely extending sides of the display device 1000-1.

Hereinafter, the description will be provided with respect to the display device 1000 being folded about a longitudinal axis. However, exemplary embodiments are not limited thereto, and the structures to be described later may also be applied to the display device 1000-1 folded about the transverse axis.

Figure 3A:
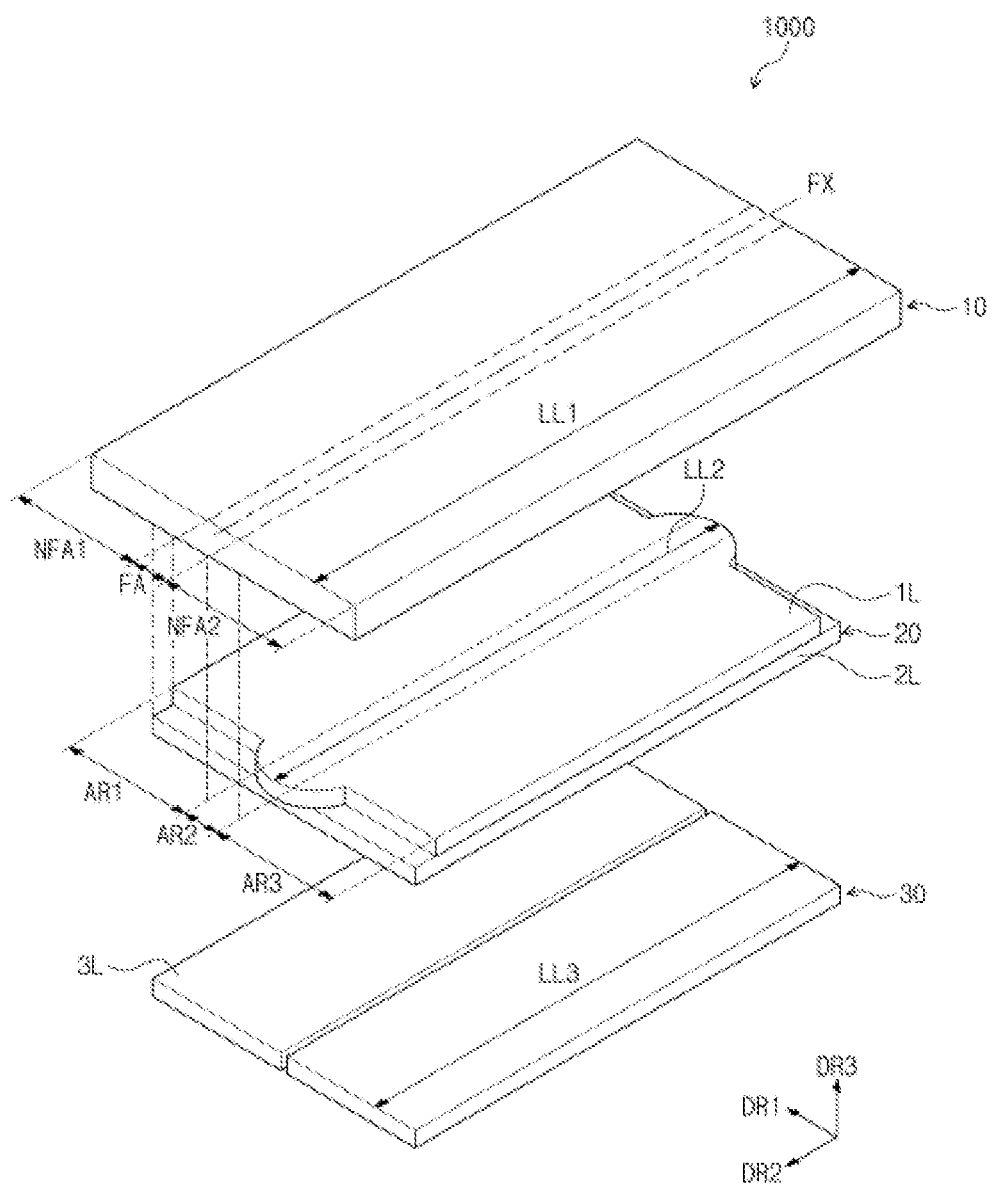
FIG. 3A is an exploded perspective view of an exemplary embodiment of a display device having a plurality of modules constructed according to the principles of the invention.
Figure 3B:
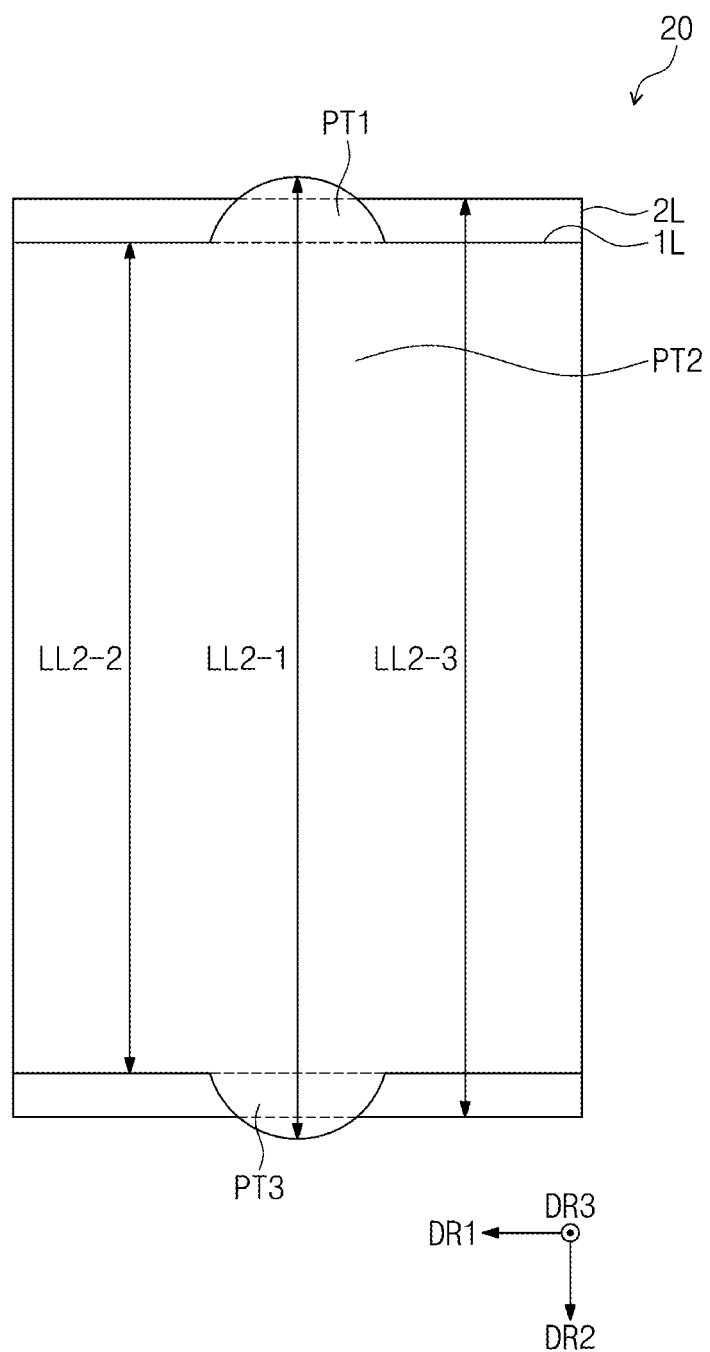
FIG. 3B is a plan view of an exemplary embodiment of one of the modules of FIG. 3A.

FIG. 3A is an exploded perspective view of an exemplary embodiment of a display device having a plurality of modules constructed according to the principles of the invention. FIG. 3B is a plan view of an exemplary embodiment of one of the modules of FIG. 3A.

Referring to FIG. 3A, the display device 1000 may include a first module 10, a second module 20, and a third module 30. The first module 10, the second module 20, and the third module 30 may be coupled in the same order as that in FIG. 3A through a sticking agent or an adhesive. In an exemplary embodiment, the first module 10 may be disposed directly on the second module 20 and the second module may be disposed directly on the third module 30.

In the first module 10, a first non-foldable region NFA1, a foldable region FA, and a second non-foldable region NFA2 may be defined sequentially in the first direction DR1. The foldable region FA may be disposed between first and second non-foldable regions NFA1 and NFA2. Each of the first non-foldable region NFA1, the foldable region FA, and the second non-foldable region NFA2 may extend in the second direction DR2 intersecting the first direction DR1.

The foldable region FA may be folded about a folding axis FX defined on the upper surface of the first module 10. In an exemplary embodiment, the folding axis FX may extend longitudinally in the second direction DR2.

When the foldable region FA is folded, the first non-foldable region NFA1 and the second non-foldable region NFA2 may face each other. FIG. 3A illustrates that the folding axis FX is defined on the upper surface of the first module 10, but exemplary embodiments are not limited thereto, and the folding axis may also be defined on the lower surface of the third module 30. When the foldable region FA is folded, the bottom surface of the first non-foldable region NFA1 and the bottom surface of the second non-foldable region NFA2 may face each other.

The first module 10 may include a display module and a plurality of functional layers. This will be described in more detail in FIG. 4A.

The second module 20 may include a first region AR1, a second region AR2, and a third region AR2 sequentially defined in the first direction DR1. The first region AR1 overlap the first non-foldable region, the second region AR2 overlaps the foldable region FA, and the third region AR3 overlaps the second non-foldable region NFA2. The first region AR1 and the third region AR3 are non-foldable regions and the second region AR2 may be a foldable region.

The second region AR2 may be folded about the folding axis FX defined on the upper surface of the first module 10. In this case, the upper surface of the first region AR1 and the upper surface of the third region AR3 may face each other. However, exemplary embodiments are not limited thereto. According to the position of the folding axis, the bottom surface of the first region AR1 and the bottom surface of the third region AR3 may face each other.

The second module 20 may include a first layer 1L and a second layer 2L. On the first layer 1L, the foldable region FA, the first non-foldable region NFA1, and the second non-foldable region NFA2 may be defined. The first layer 1L may include one of more barriers in the form of barrier layers MB of FIG. 5A. The second layer 2L may include a plurality of functional layers such as a cushion layer CS of FIG. 5A.

The third module 30 may correspond to a set SET of the display device 1000. For example, the third module 30 may include a metal plate, a camera module, a main board, and a battery. The third module 30 may include a third layer 3L.

The first to third layers 1L, 2L, and 3L may be coupled in a third direction DR3 via a sticking agent or an adhesive. In an exemplary embodiment, the first layer 1L may be disposed directly on the second layer 2L, and the second layer 2L may be disposed directly on the third layer 3L.

The configuration of the display device 1000 is not limited thereto, and for example, the display device 1000 may further include a housing disposed below the third module 30. The housing may accommodate the first to third modules 10, 20 and 30.

In an exemplary embodiment, the length LL1 of the first module 10 may be greater than the length LL2 of the second module 20 and the length LL3 of the third module. As used herein, lengths refer to the lengths of elements as measured in the second direction DR2.

Referring to FIG. 3B, the second module 20 may include a first layer 1L and a second layer 2L. The first layer 1L may include a first portion, which may be in the form of a flat portion PT2, and at least one second portion, which may be in the form of two protruding portions PT1 and PT3 spaced apart from each other. The protruding portions PT1 and PT3 may extend from ends of the substantially flat portion PT2. All of the portions PT1 to PT3 may be substantially flat in a plane extending in directions DR1 and DR2

When viewed in plan, the length LL2-1 of the first layer 1L may be the maximum value of the distance between the ends of the two protruding portions PT1 and PT3. However, exemplary embodiments are not limited thereto. In an exemplary embodiment, when the first layer 1L includes only one protruding portion, the length of the first layer 1L may be the maximum value of the length from the one end of the protruding portion to the one end of the flat portion.

In an exemplary embodiment, the length LL2-1 of the first layer 1L may be greater than the length LL2-3 of the second layer 2L. Specifically, the length LL2-2 of the first layer 1L may be smaller than the length LL2-3 of the second layer 2L, and the length LL2-1 of the first layer 1L may be greater than the length LL2-3 of the second layer 2L due to the lengths of the protruding portions PT1 and PT3.

However, exemplary embodiments are not limited thereto, and the length LL2-1 of the first layer 1L may be equal to the length LL2-3 of the second layer 2L.

Within the range in which the length LL2-1 of the first layer 1L and the length LL2-3 of the second layer 2L are smaller than the length LL1 of the first module 10, the length LL2-1 of the first layer 1L and the length LL2-3 of the second layer 2L may be changed without limit.

Figure 4A:
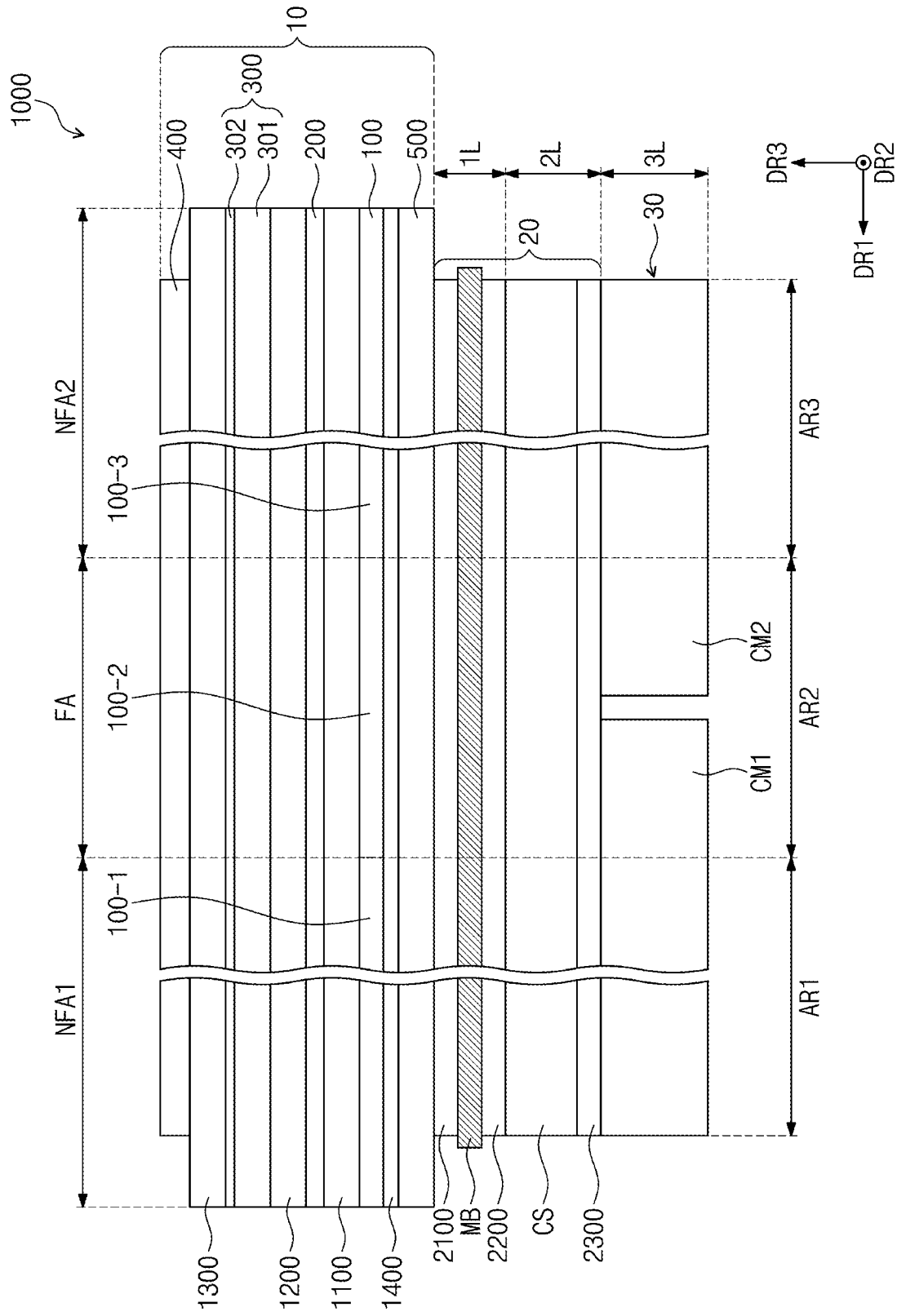
FIG. 4A is a cross-sectional view of an exemplary embodiment of the display device of FIG. 3A.
Figure 4B:
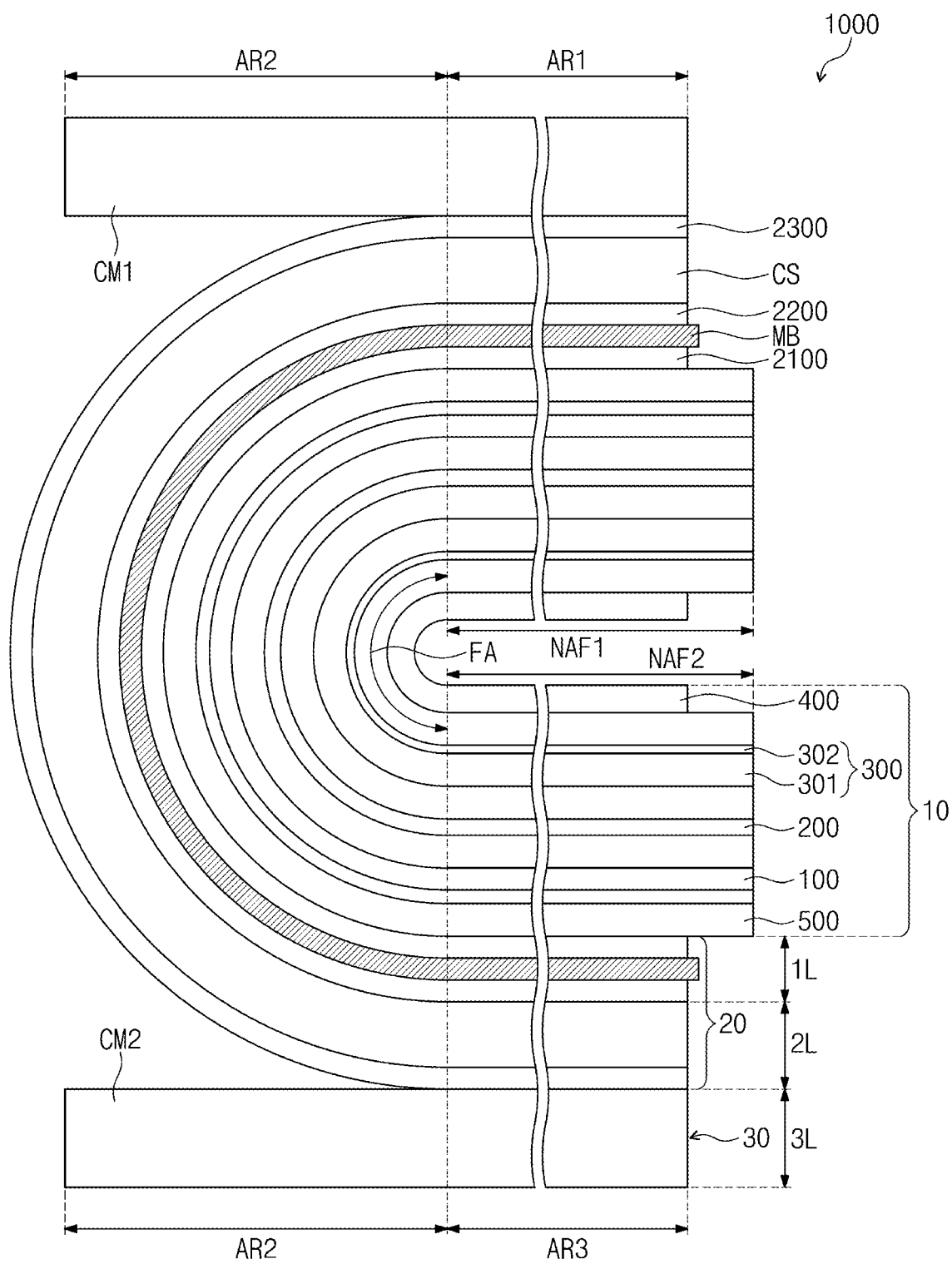
FIG. 4B is a cross-sectional view of the display device of FIG. 4A in a folded position.

FIG. 4A is a cross-sectional view of an exemplary embodiment of the display device of FIG. 3A. FIG. 4B is a cross-sectional view of the display device of FIG. 4A in a folded position.

FIG. 4A illustrates a display device 1000 in an unfolded position. FIG. 4B illustrates the display device 1000 in a folded position.

Referring to FIGS. 4A and 4B, the display device 1000 may include a first module 10, a second module 20, and a third module 30.

The first module 10 may include a display module 100, an anti-reflection layer 200, a window 300, an upper protective film 400, and a lower protective film 500. FIG. 4B illustrates the first module 10 while omitting specific configuration details of the first module.

As used herein a substrate may refer to at least one of the configurations included in the first module 10. For example, the substrate may be a display module 100. However, exemplary embodiments are not limited thereto, and the substrate may be the first module 10. The description of the first module 10 will be applied to the substrate in the same manner. The display module 100 may display an image WI (see FIG. 1A) and detect an external input TC (see FIG. 1A). The external input TC may be an input of a user. The input of a user includes various types of external inputs, such as a portion of user's body, light, heat, pen or pressure. In FIG. 1A, the external input TC is illustrated as user's hand applied on the display surface DS. However, this is exemplarily illustrated, and as described above, the external input TC may be provided in various forms. In addition, external inputs TC applied to side surfaces and the rear surface of the display device 1000 may also be detected according to the structure of the display device 1000, and exemplary embodiments are not limited thereto.

The display module 100 may include a display panel that generates an image and an input detecting layer that acquires the coordinate information about external inputs.

The display panel may be light-emitting display panel, and is not particularly limited. For example, the display panel may be an organic light-emitting display panel, a quantum dot light-emitting display panel or other known panels. The light-emitting layer of the organic light-emitting display panel may include an organic light-emitting material. The light-emitting layer of the quantum dot display panel may include quantum dots, quantum rods and the like.

The input detecting layer may be disposed directly on the display panel. For example, the input detecting layer may be formed directly on the display panel through a continuous process. The input detecting layer may include a plurality of insulating layers and a plurality of conductive layers. The plurality of conductive layers may constitute a detecting electrode for detecting an external input, a detecting line connected to the detecting electrode, and a detecting pad connected to the detecting line. The input detecting layer may detect an external input through a mutual cap method and/or a self cap method. However, external input detecting method is not limited thereto.

In the display module 100, a first display region 100-1, a second display region 100-2, and a third display region 100-3 may be defined. The first display region 100-1 may correspond to the first non-foldable region NFA1 of FIG. 1A, the second display region 100-2 may correspond to the foldable region FA of FIG. 1A, and the third display region 100-3 may correspond to the second non-foldable region NFA2 of FIG. 1A. In an exemplary embodiment, the first display region 100-1 and the third display region 100-3 may be non-foldable regions and the second display region 100-2 may be a foldable region.

The anti-reflection layer 200 may be disposed on the display module 100. The reflectivity of external light incident from the outside of the anti-reflection layer 200 may be decreased. The anti-reflection layer 200 may include a retarder and a polarizer. The retarder may be of film type or liquid crystal coating type, and include $\lambda/2$ retarder and/or $\lambda/4$ retarder. The polarizer may also be of film type or liquid crystal coating type. The film-type polarizer may include a stretchable synthetic resin film and the liquid crystal coating-type polarizer may include liquid crystals aligned in predetermined arrays. The retarder and the polarizer may further include protective films.

Alternatively, the anti-reflection layer 200 may include color filters. The color filters have a predetermined array. The arrays of the color filters may be determined considering the light-emitting colors of the pixels included in the display panel. The anti-reflection layer 200 may further include a black matrix adjacent to the color filters.

Alternatively, the anti-reflection layer 200 may include a destructive interference structure. For example, the destructive interference structure may include a first reflective layer and a second reflective layer which are disposed on mutually different layers. A first reflective beam and a second reflective beam which are respectively reflected from the first reflective layer and the second reflective layer may be destructively interfered, and thus, the external light reflectivity may be decreased.

An adhesive layer 1100 may be disposed between the display module 100 and the anti-reflection layer 200. The display module 100 and the anti-reflection layer 200 may be coupled to each other by the adhesive layer 1100.

In an exemplary embodiment, the adhesive layer 1100 may not be provided. The adhesive layers described herein may include a general adhesive or a sticking agent. For example, the adhesive layers may each be a pressure sensitive adhesive (PSA), an optical clear adhesive (OCA), or an optical clear resin (OCR).

The window 300 may be disposed on the anti-reflection layer 200. The window 300 may include a base layer 301 and a functional coating layer 302. The base layer 301 may include a glass substrate and/or a synthetic resin film, etc. For example, the base layer 301 may include a polyimide film. The base layer 301 is not limited to a single layer. The base layer 301 may include two or more films coupled by an adhesive member. For example, the base layer 301 may include a first synthetic resin layer, a silicon oxide layer disposed on the first synthetic resin layer, an amorphous silicon (a-Si) layer disposed on the silicon oxide layer, and a second synthetic resin layer disposed on the amorphous silicon oxide layer.

Each of the first and second synthetic resin layers may include a polyimide resin. In addition, each of the first and second synthetic resin layers may include at least one among acrylate resins, methacrylate resins, polyisoprene resins, vinyl resins, epoxy resins, urethane resins, cellulose resins, siloxane resins, polyamide resins or perylene resins.

The functional coating layer 302 may include at least one among a fingerprint preventing layer, an anti-reflection layer, or a hard coating layer.

An adhesive layer 1200 may be disposed between the window 300 and the anti-reflection layer 200, but the adhesive layer 1200 may not be provided.

The upper protective film 400 may be disposed on the window 300. The shock resistance characteristic of the display device 1000 may be improved by adding the upper protective film 400. The upper protective film 400 may be a polymer film or a reinforced glass film. The adhesive layer 1300 may be disposed between the upper protective film 400 and the window 300, but the adhesive layer 1300 may not be provided. Alternatively, in an exemplary embodiment, the upper protective film 400 may not be provided.

The lower protective film 500 may be disposed under the display module 100. The lower protective film 500 may be a layer that protects the rear surface of the display module 100. The lower protective film 500 may include a synthetic resin film and may be, for example, a polyimide film or a polyethylene terephthalate film. However, this is merely an example, and the lower protective film 500 is not limited to the example. The adhesive layer 1400 may be disposed between the lower protective film 500 and the display module 100.

The second module 20 may include a first layer 1L and a second layer 2L. It was exemplarily illustrated that the first layer 1L is disposed under the first module 10 and the second layer 2L is disposed under the first layer 1L.

In the first layer 1L, a first region AR1, a second region AR2, and a third region AR2 may be sequentially defined in the first direction DR1. The first region AR1 corresponds to and/or overlaps the first non-foldable region NFA1 of the first module 10, the second region AR2 corresponds to and/or overlaps the foldable region FA, and the third region AR3 corresponds to and/or overlaps the second non-foldable region NFA2. That is, the first region AR1 and the third region AR3 are non-foldable regions and the second region AR2 may be a foldable region.

In an exemplary embodiment, the first layer 1L may include a barrier, which may be in the form of a barrier layer MB, a first adhesive layer 2100, and a second adhesive layer 2200. The second layer 2L may include a cushion layer CS and a third adhesive layer 2300.

The barrier layer MB may be disposed under the first module 10. The first adhesive layer 2100 may be disposed between the barrier layer MB and the first module 10. The barrier layer MB and the first module 10 may be coupled to each other by the first adhesive layer 2100.

The barrier layer MB may be a metal-containing metal thin film. The thickness of the barrier layer MB may be about 10-50 μm inclusive. The barrier layer MB may contain at least one of aluminum, nickel, copper, iron, or titanium. Alternatively, the barrier layer MB may include an alloy including one or more among the metals. For example, the barrier layer MB may include a stainless steel, a Ti alloy, or invar. However, exemplary embodiments are not limited thereto. The cushion layer CS may be disposed under the barrier layer MB. The cushion layer CS may have an elongate shape of a bar made of a film or a cushion. The cushion layer CS may include a sponge, a foamed form, a urethane resin, or the like. The cushion layer CS may support the barrier layer MB and prevent pressing phenomenon and plastic deformation in the thickness direction of the barrier layer MB. The deformation of the display module 100 and the barrier layer MB may be caused by repeated pressing, folding, and unfolding due to external force.

The second adhesive layer 2200 may be disposed between the barrier layer MB and the cushion layer CS. The barrier layer MB and the cushion layer CS may be coupled to each other by the second adhesive layer 2200.

The third adhesive layer 2300 may be disposed under the cushion layer CS. The cushion layer CS and the third module 30 may be coupled to each other by the third adhesive layer 2300.

In an exemplary embodiment, the adhesive layers 2100, 2200, and 2300 may not be provided. The adhesive layers described herein may include a general adhesive or a sticking agent. For example, the adhesive layers may each be a pressure sensitive adhesive (PSA), an optical clear adhesive (OCA), or an optical clear resin (OCR).

A third module 30 may be disposed under the second module 20. In an exemplary embodiment, the third module 30 may include metal plates CM1 and CM2 on the third layer 3L.

In an exemplary embodiment, the metal plates CM1 and CM2 may include stainless steel, aluminum or an alloy thereof. The metal plates CM1 and CM2 have thicknesses of at least about 150 μm, and thus may protect the first module 10 and the second module 20 from the outside and improve the durability of the display device 1000.

The metal plates CM1 and CM2 may overlap the first region AR1, the third region AR3, and at least a portion of the second region AR2. The metal plates CM1 and CM2 may include a first plate CM1 and a second plate CM2 which are spaced from each other. Specifically, the first plate CM1 may support portions corresponding to the first region AR1 and a half of the second region AR2 adjacent to the first region AR1. The second plate CM2 may support portions corresponding to the third region AR3 and a half of the second region AR2 adjacent to the third region AR3.

The first module 10 and the second module 20 may be in-folded as illustrated in FIG. 4B by folding the foldable region FA and the second region AR2. The third module 30 may not include a foldable region, and when folding the display device 1000, the third module may be disposed in a shape in which the first and second plates CM1 and CM2 face each other.

In an exemplary embodiment, the barrier layer MB may have a substantially flat first position and a second position in which the second region AR2 is bent and the first region AR1 and the third region AR3 face each other. Specifically, FIG. 4A illustrates the first position and FIG. 4B illustrates the second position. The first position may represent an unfolded position of the display device 1000, and the second position may represent a folded position of the display device 1000.

The barrier layer MB is provided with the second region AR2 overlapping the foldable region FA and may prevent foreign substances from infiltrating into the display module 100 while supporting the display module 100. For example, barrier layer MB may prevent foreign substances or the like from infiltrating into cracks, tears, gaps, holes of other defects in the display module 10 caused by repeated folded and unfolded of the display device 1000.

Exemplary embodiments are not limited to the stacking structure of the display device 1000 shown in FIGS. 4A and 4B. For example, the stacking structure of the second module 20 may be changed. For example, at least one of the first layer 1L and the second layer 2L may be provided in plural. Alternatively, the upper and lower structures of the first layer 1L and the second layer 2L may be changed.

Figure 5A:
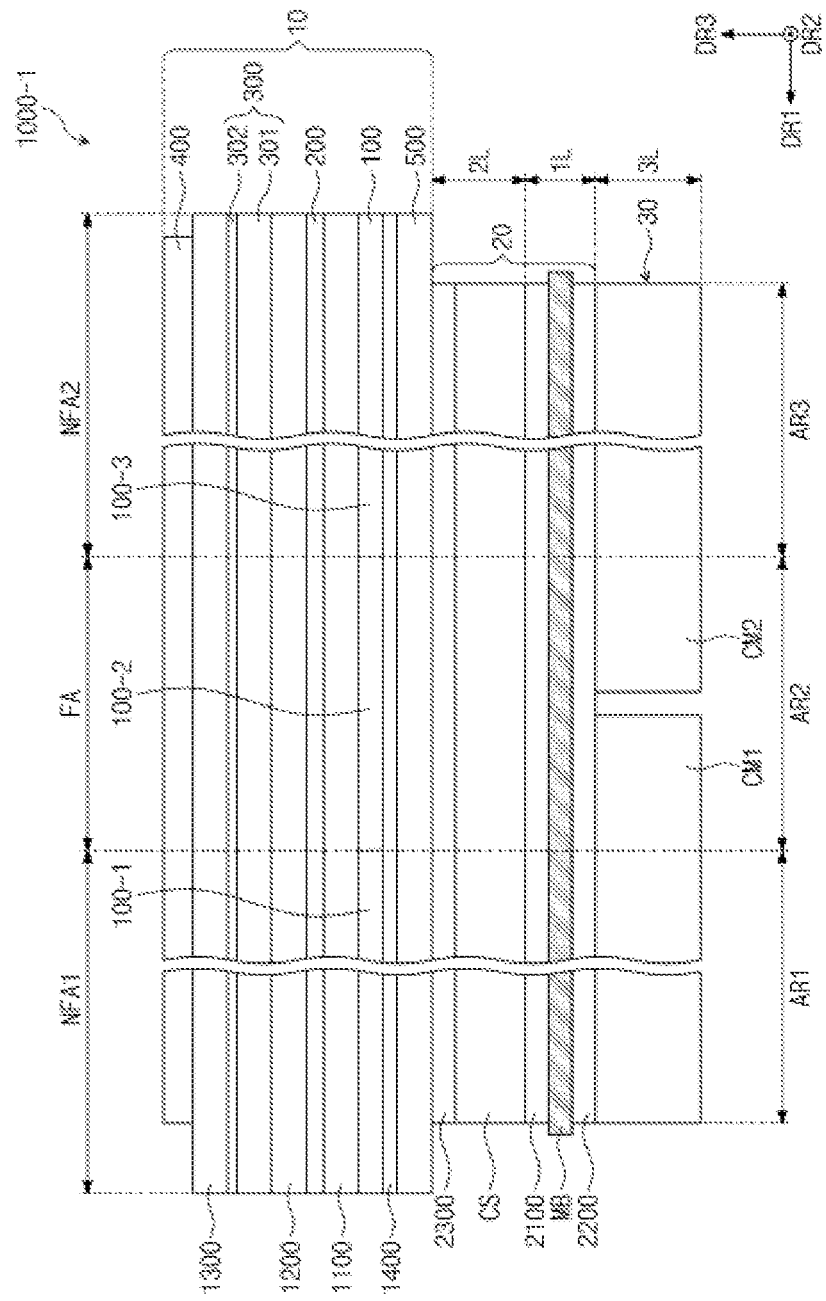
FIG. 5A is a cross-sectional view of another exemplary embodiment of the display device of FIG. 3A.
Figure 5B:
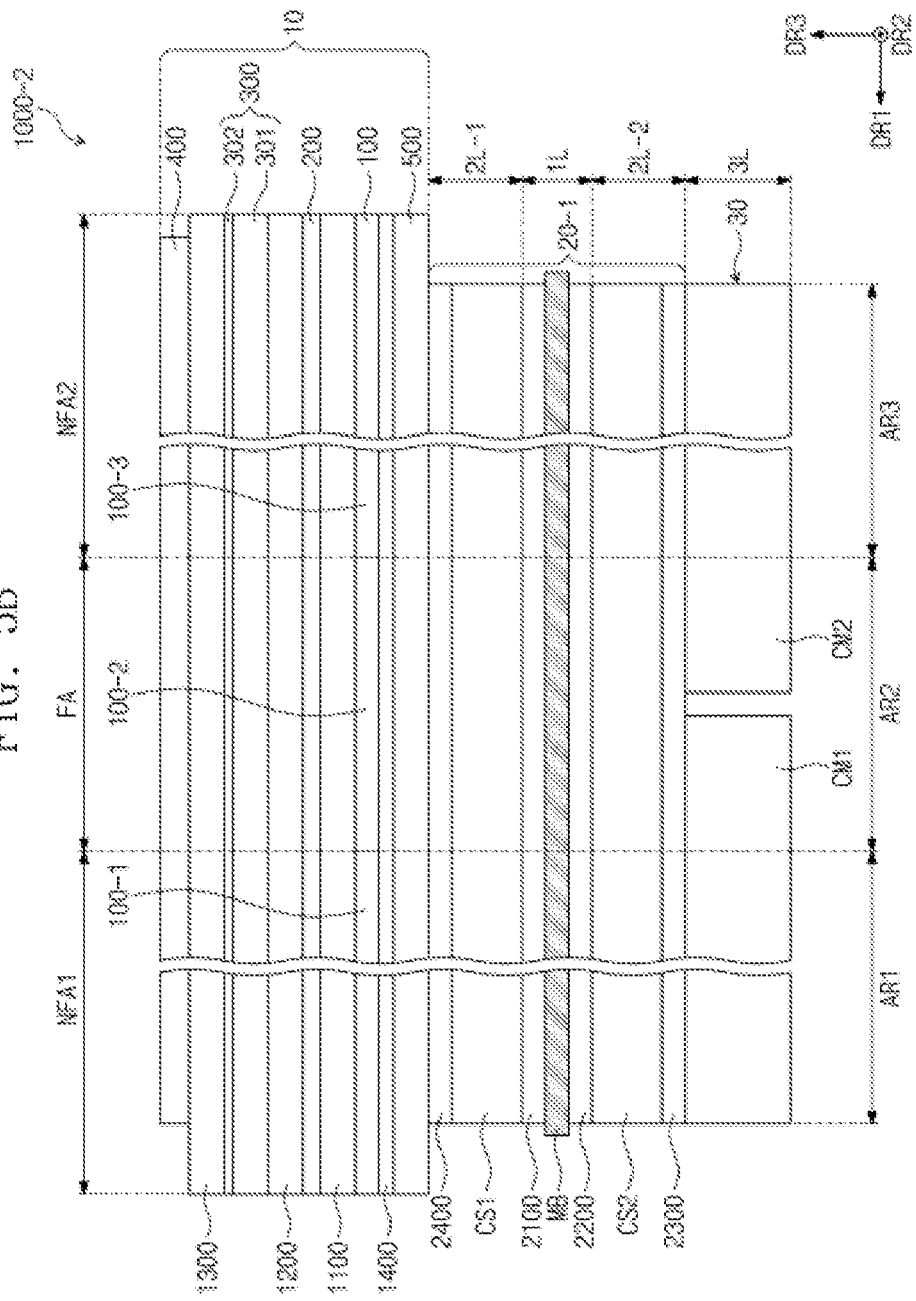
FIG. 5B is a cross-sectional view of still another exemplary embodiment of the display device of FIG. 3A.

FIG. 5A is a cross-sectional view of another exemplary embodiment of the display device of FIG. 3A. FIG. 5B is a cross-sectional view of still another exemplary embodiment of the display device of FIG. 3A.

Display devices 1000-1 and 1000-2 illustrated in FIGS. 5A and 5B are embodiments in which a second module 20 is modified in the display device 1000 illustrated in FIG. 4A. The description for the same configurations will be omitted to avoid redundancy.

Referring to FIG. 5A, a first layer 1L may be disposed on a third module 30 in the display device 1000-1. A second layer 2L may be disposed on the first layer 1L. A first module 10 may be disposed on the second layer 2L.

Specifically, the barrier layer MB may be disposed on the third module 30. The second adhesive layer 2200 may be disposed between the barrier layer MB and the third module 30. A cushion layer CS may be disposed on the barrier layer MB. The first adhesive layer 2100 may be disposed between the barrier layer MB and the cushion layer CS.

The first module 10 may be disposed on the cushion layer CS. The third adhesive layer 2300 may be disposed between the cushion layer CS and the first module 10.

Referring to FIG. 5B, in the display device 1000-2, a second module 20-1 may include a plurality of second layers 2L-1 and 2L-2. For example, a first layer 1L may be disposed between two second layers 2L-1 and 2L-2.

A first cushion layer CS1 may be disposed under a first module 10. A fourth adhesive layer 2400 may be disposed between the first module 10 and the first cushion layer CS1.

A first layer 1L may be disposed under the first cushion layer CS1.

A second cushion layer CS2 may be disposed under the first layer 1L. A third module 30 may be disposed under the second cushion layer CS2.

A third adhesive layer 2300 may be disposed between the second cushion layer CS2 and the third module 30.

Figure 6A:
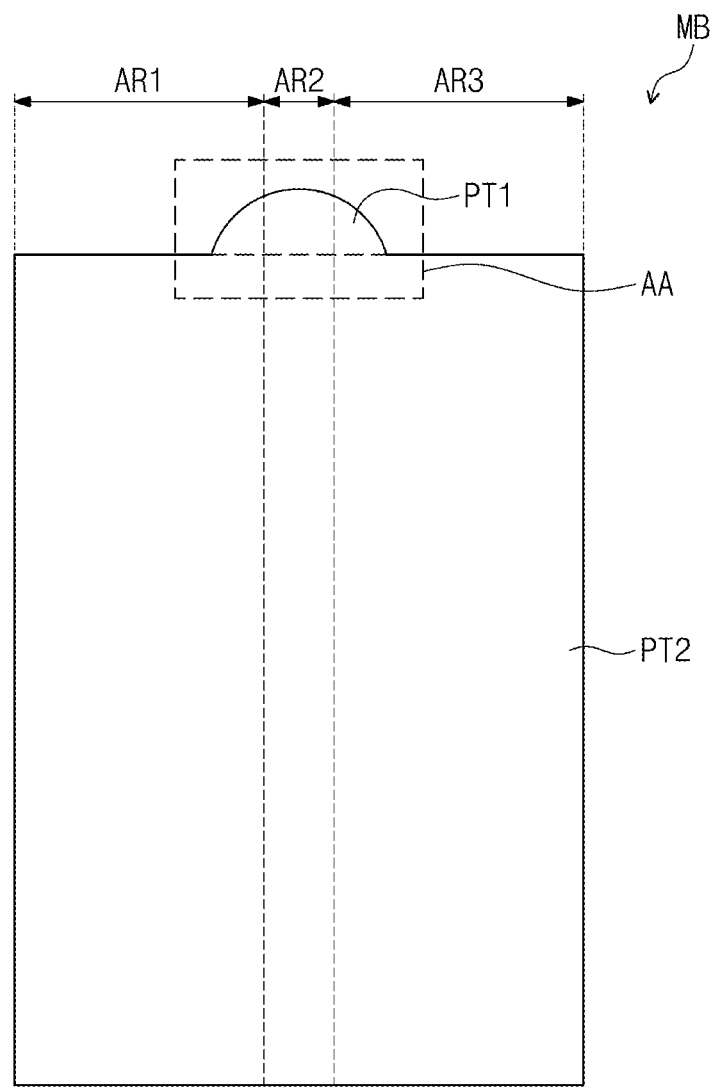
FIG. 6A is a plan view of an exemplary embodiment of a barrier layer constructed according to the principles of the invention.
Figure 6B:
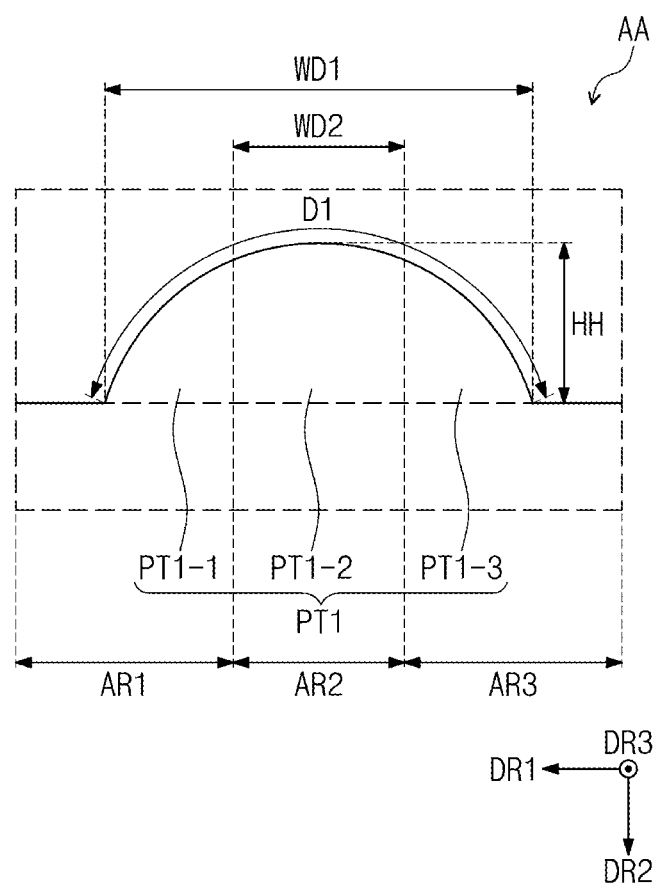
FIG. 6B is an enlarged view of region AA of FIG. 6A.
Figure 6C:
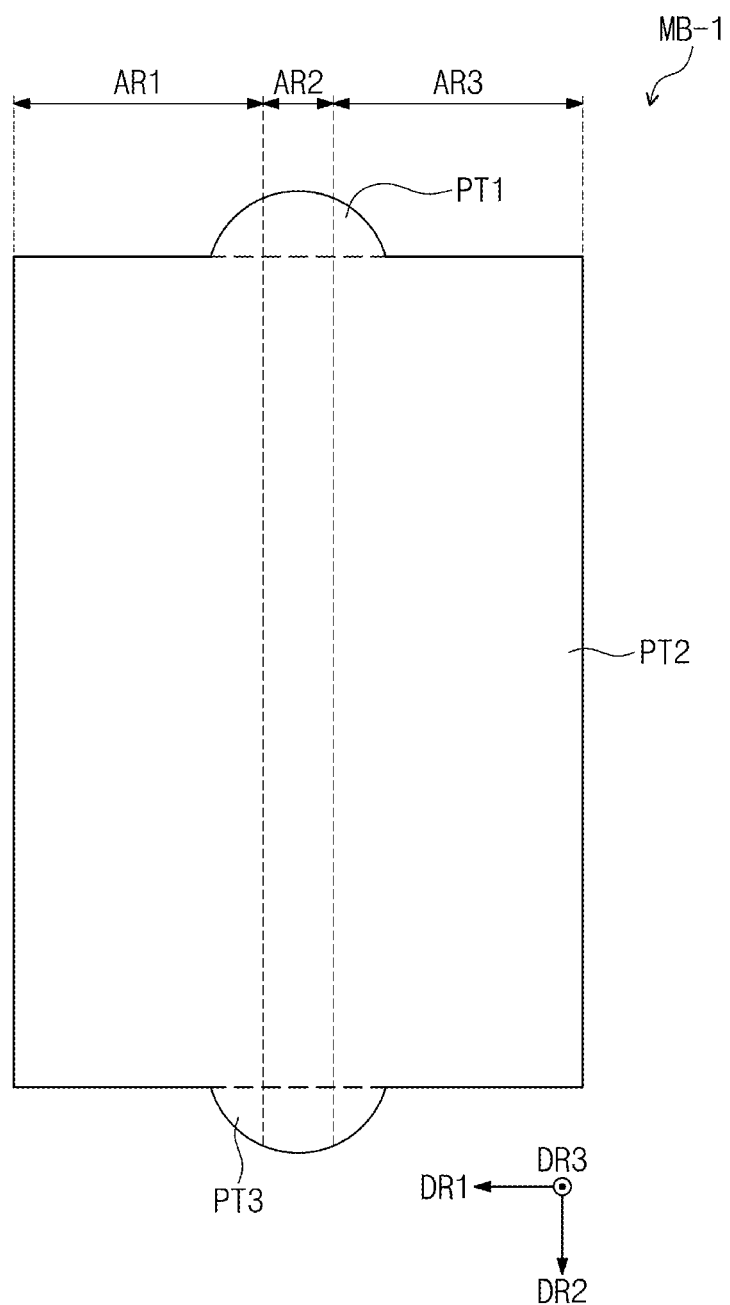
FIG. 6C is a plan view of another exemplary embodiment of a barrier layer constructed according to the principles of the invention.
Figure 6D:
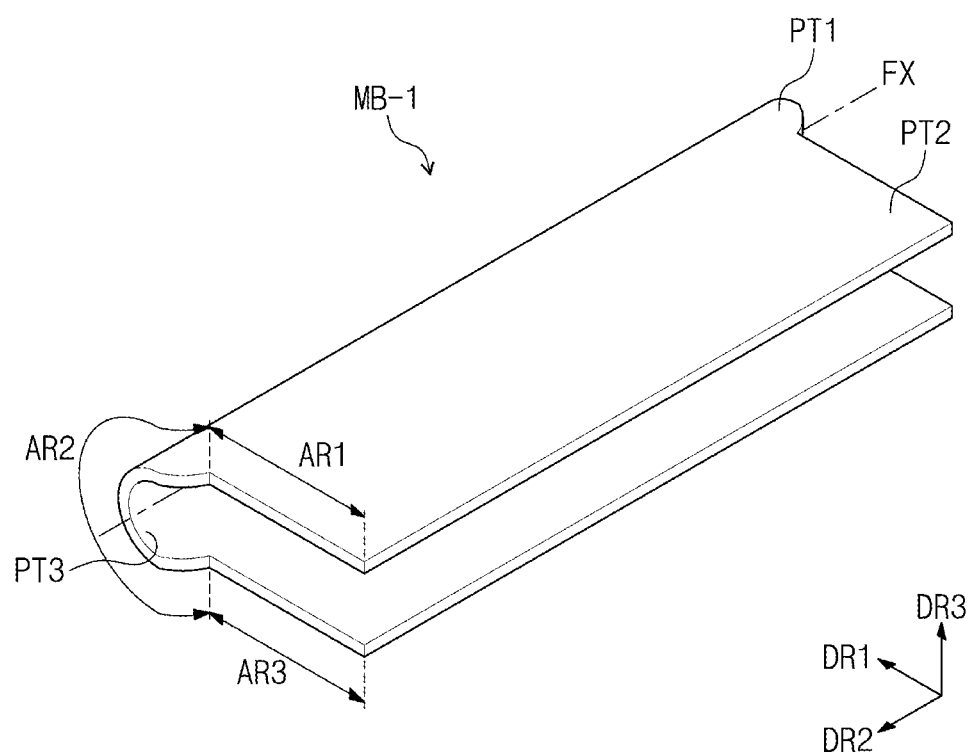
FIG. 6D is a perspective view of the barrier layer of FIG. 6C in a folded position.

FIG. 6A is a plan view of an exemplary embodiment of a barrier layer constructed according to the principles of the invention. FIG. 6B is an enlarged view of region AA of FIG. 6A. FIG. 6C is a plan view of another exemplary embodiment of a barrier layer constructed according to the principles of the invention. FIG. 6D is a perspective view of the barrier layer of FIG. 6C in a folded position.

FIGS. 6A, 6B, and 6C illustrate the barrier layers MB and MB-1 in an unfolded position.

Referring to FIG. 6A, a first region AR1, a second region AR2, and a third region AR2 may be defined sequentially in the first direction DR1. The first region AR1 corresponds to the first non-foldable region NFA1 of the first module 10 of FIG. 3A, the second region AR2 corresponds to the foldable region FA of FIG. 3A, and the third region AR3 corresponds to the second non-foldable region NFA2 of FIG. 3A. That is, in an exemplary embodiment, the first region AR1 and the third region AR3 are non-foldable regions and the second region AR2 may be a foldable region.

The barrier layer MB may include a substantially flat portion PT2 overlapping the display module 100 of FIG. 4A and a protruding portion PT1 having a shape extending from the substantially flat portion PT2.

In an exemplary embodiment, the substantially flat portion PT2 may have a generally rectangular shape including long sides and short sides. In the substantially flat portion PT2, the first to third regions AR1, AR2, and AR3 may be defined sequentially in the first direction DR1.

The protruding portion PT1 may extend from the substantially flat portion PT2 in the second direction DR2. The protruding portion PT1 may overlap the first to third regions AR1, AR2 and AR3 in the second direction DR2. For example, the protruding portion PT1 may overlap at least a portion of the first region AR1 and the third region AR3 in the second direction DR2, and overlap the entire second region AR2. However, exemplary embodiments are not limited thereto. In another exemplary embodiment, the protruding portion PT1 may overlap only the second region AR2. Referring to FIG. 6B, the protruding portion PT1 may include a first sub portion PT1-1, a second sub portion PT1-2, and a third sub portion PT1-3.

The first sub portion PT1-1 may overlap a first region AR1, the second sub portion PT1-2 may overlap a second region AR2, and a third sub portion PT1-3 may overlap a third region AR3 in the second direction DR2. That is, the first sub portion PT1-1 and the third sub portion PT1-3 may overlap the non-foldable regions NFA1 and NFA2 and the second sub portion PT1-2 may overlap the foldable region FA. The second sub portion PT1-2 may overlap and be folded about the folding axis FX of FIG. 3A. In this manner, the protruding portion PT1 includes the second sub portion PT1-2 to be folded about the folding axis FX and the first sub portion PT1-1 and the third sub portion PT1-3 on both sides of the second sub portion PT1-2, which may distribute stress generated in the barrier layer MB during folding.

However, exemplary embodiments are not limited thereto. According to another exemplary embodiment, the protruding portion PT1 may overlap the second region AR2 without overlapping the first region AR1 and the third region AR3. For example, the protruding portion PT1 may not be provided with the first sub portion PT1-1 and the third sub portion PT1-3 but only the second sub portion PT1-2.

The stress generated in the barrier layer MB due to folding may be distributed appropriately by adjusting the width of the protruding portion PT1. For example, the radius of curvature of the protruding portion PT1 may be adjusted so as to be smaller than the radius of curvature of the second region AR2.

For example, the width WD1 of the protruding portion PT1 may be in a range of about 3-10 mm inclusive. For example, the width WD1 of the protruding portion PT1 may be about 3-5 mm inclusive or about 6-10 mm inclusive. The width WD2 of the second region AR2 may be in a range of about 6-8 mm inclusive.

Within the range of the width WD1, the protruding portion PT1 may have a smaller radius of curvature than the substantially flat portion PT2. For example, an arc of the protruding portion PT1 may have a first length D1 longer than the width WD1, which may allow the protruding portion PT1 to be folded with a radius of curvature less than that of the substantially flat portion PT2. Accordingly, the stress generated while the second region AR2 of the barrier layer MB is folded may be distributed into the protruding portion PT1 to prevent damage to the barrier layer MB. For example, relatively high stress applied to the edge of the substantially flat portion PT2, such as a part of the substantially flat portion PT2 adjacent to the protruding portion, may be distributed to the protruding portion PT1. The height (or length) HH by which the protruding portion PT1 extends from the substantially flat portion PT2 may be about 100-2,000 μm. For example, the height HH may be about 400-500 μm. Within the range of the height HH, the protruding portion PT1 is not exposed out of the first module 10, does not affect the external appearance of the display device 1000, and may reduce the stress generated in the display device 1000.

Referring to FIG. 6C, a barrier layer MB-1 of may include a plurality of protruding portions. For example, the barrier layer MB-1 may include a first protruding portion PT1 and a second protruding portion PT3. The first protruding portion PT1 may protrude from one side of the substantially flat portion PT2 in a direction substantially parallel to the second direction DR2. The second protruding portion PT3 may protrude from other side of the substantially flat portion PT2 substantially parallel to the one side of the substantially flat portion PT2. Specifically, each of the first protruding portion PT1 and the second protruding portion PT3 may extend toward both sides from the substantially flat portion PT2 overlapping the second region AR2.

FIG. 6C illustrates that the barrier layer MB-1 includes two protruding portions PT1 and PT3, but exemplary embodiments are not limited thereto, and the barrier layer may include three or more protruding portions.

FIG. 6D illustrates the barrier layer MB-1 in a folded position.

Referring to FIG. 6D, in the barrier layer MB-1, the second region AR2 may be a foldable region. The second region AR2 may be bent about the folding axis FX. The folding axis FX may be defined on the upper surface of the first module 10 of FIG. 3A.

Referring to FIGS. 6D and 4B, when the display device 1000 is folded, the protruding portions PT1 and PT3 may be folded while the second region AR2 of the barrier layer MB-1 included in the second module 20 is folded.

At this point, stress may be generated in the barrier layer MB-1 due to folding, and the stress may be concentrated particularly at the ends of the substantially flat portion PT2 overlapping the second region AR2. The barrier layer MB-1 includes the protruding portions PT1 and PT3 on at least one of the ends of the substantially flat portion PT2 overlapping the second region AR2 and thus, the stress may be more evenly distributed. Accordingly, occurrence of damage, such as cracks, tears, gaps, openings, or the like in the barrier layer MB-1 due to folding may be reduced or prevented.

In FIGS. 6A to 6D, it is illustrated that the first protruding portion PT1 has a generally semi-circular shape, but exemplary embodiments are not limited thereto.

Figure 7A:
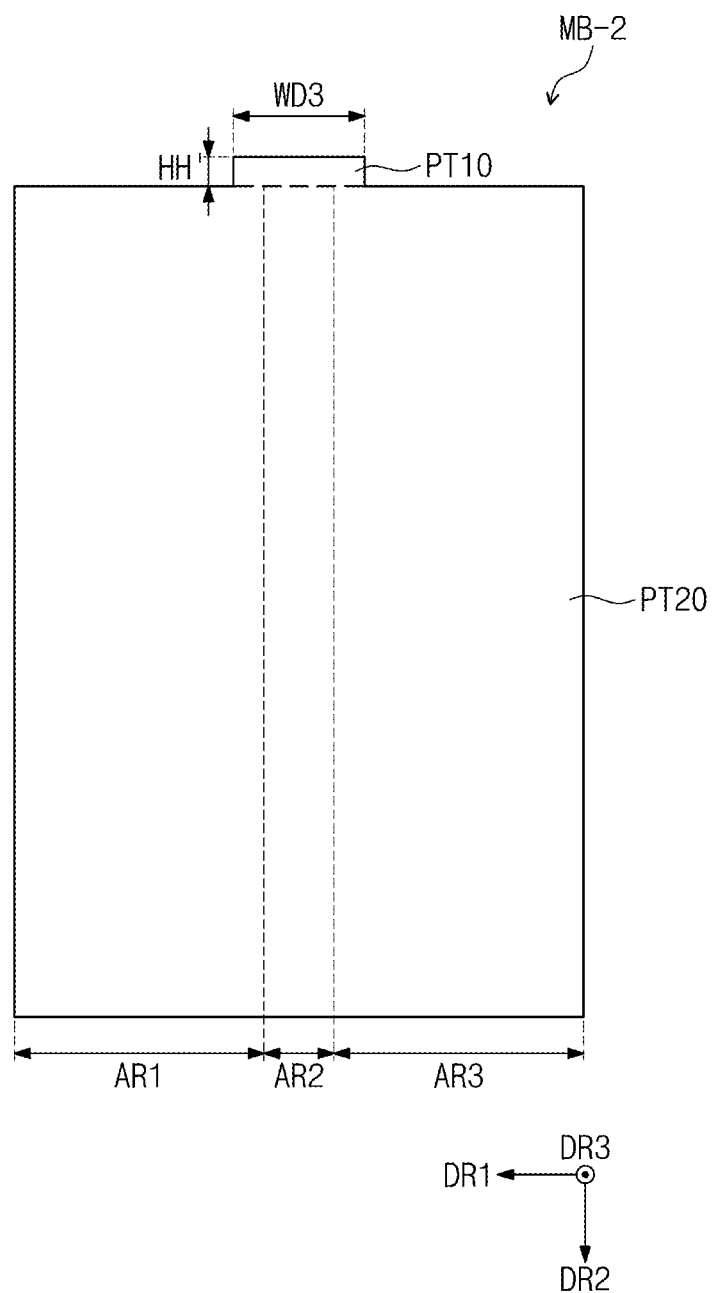
FIG. 7A is a plan view of still another exemplary embodiment of a barrier layer constructed according to the principles of the invention.

FIG. 7A is a plan view of still another exemplary embodiment of a barrier layer constructed according to the principles of the invention.

Referring to FIG. 7A, a barrier layer MB-2 may include a protruding portion PT10 and a substantially flat portion PT20. The protruding portion PT10 may have a generally rectangular shape.

The width WD3 of the protruding portion PT10 may be about 3-10 mm inclusive. For example, the width WD3 may be about 3-5 mm inclusive, or about 6-10 mm inclusive. The height (or length) HH by which the protruding portion PT10 protruding from the substantially flat portion PT20 may be about 100-2,000 μm. For example, the height HH may be about 400-500 μm inclusive. The description of FIGS. 6A to 6D may be applied in the same manner to the description on the protruding portion PT10 and will not be repeated here to avoid redundancy.

Figure 7B:
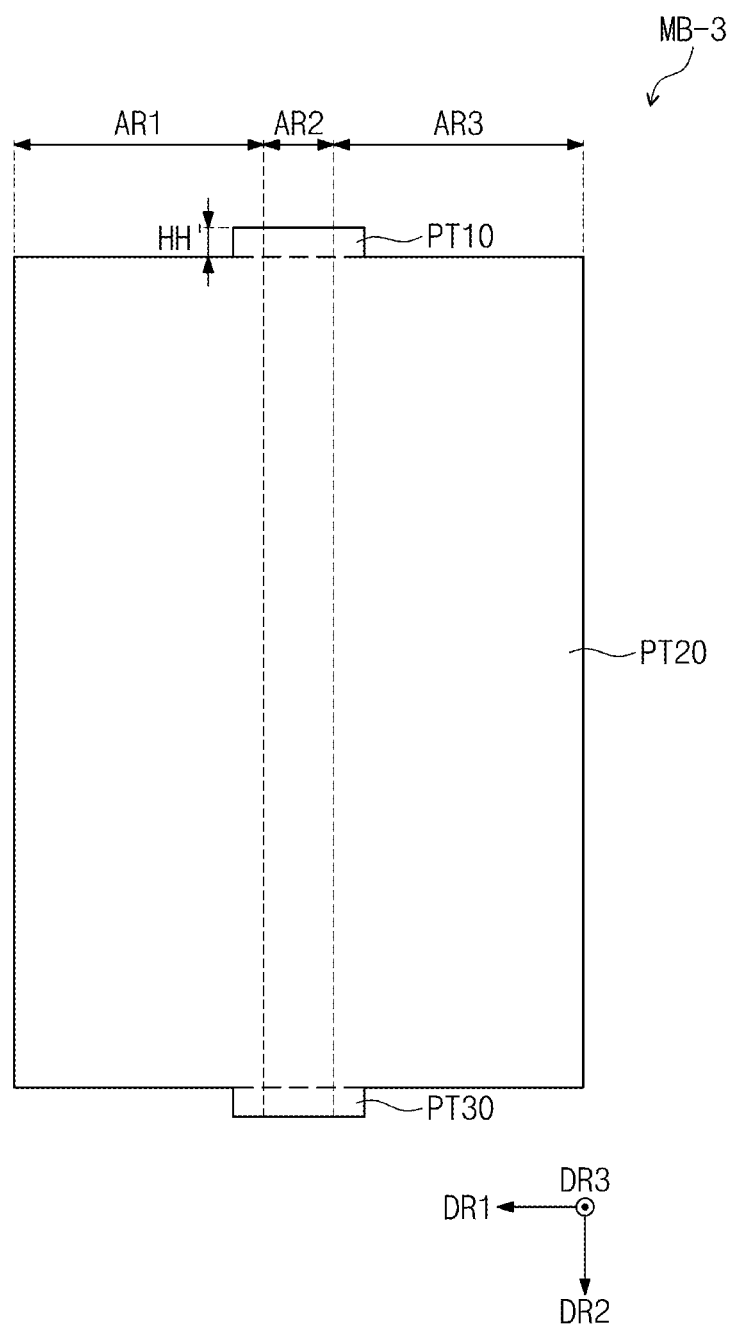
FIG. 7B is a plan view of yet another exemplary embodiment of a barrier layer constructed according to the principles of the invention.

FIG. 7B is a plan view of yet another exemplary embodiment of a barrier layer constructed according to the principles of the invention.

Referring to FIG. 7B, a barrier layer MB-3 may include a plurality of protruding portions PT10 and PT30 and a substantially flat portion PT20. For example, the barrier layer MB-3 may include a first protruding portion PT10 and a second protruding portion PT30 each having a generally rectangular shape.

The first protruding portion PT10 may protrude from one side of the substantially flat portion PT20 in a direction substantially parallel to the second direction DR2. The second protruding portion PT30 may protrude in the second direction DR2 from other side of the substantially flat portion PT20 substantially parallel to the one side of the substantially flat portion PT20. Specifically, each of the first protruding portion PT10 and the second protruding portion PT30 may extend toward both sides from the substantially flat portion PT20 overlapping the second region AR2.

The description of FIGS. 6A to 6D may be applied to other configurations and embodiments and will not be repeated here to avoid redundancy.

Figure 8A:
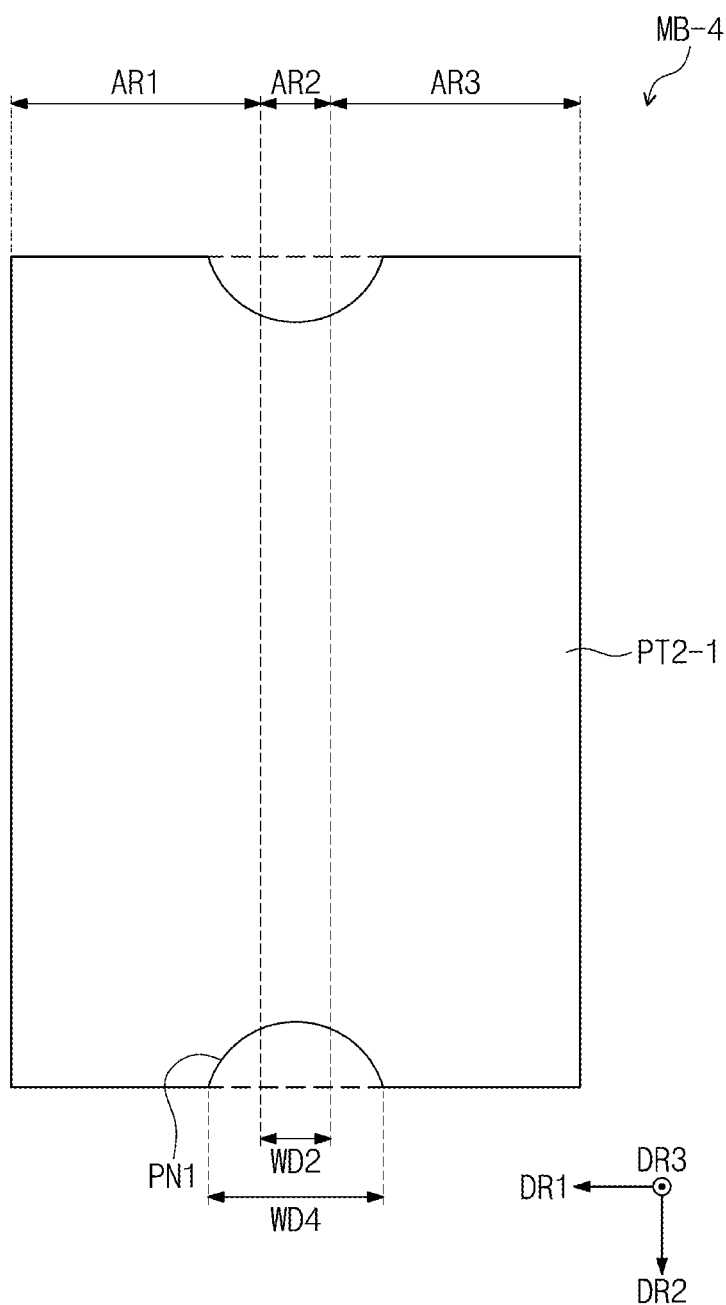
FIG. 8A is a plan view of still yet another exemplary embodiment of a barrier layer constructed according to the principles of the invention.

FIG. 8A is a plan view of still yet another exemplary embodiment of a barrier layer constructed according to the principles of the invention.

Referring to FIG. 8A, a barrier layer MB-4 may include a pattern PN1 having a shape recessed into a substantially flat portion PT2-1. In an exemplary embodiment, the width WD4 of the pattern PN1 may be greater than the width WD2 of a second region AR2. The pattern PN1 may overlap the first to third regions AR1, AR2 and AR3 in the second direction DR2. For example, the protruding portion PT1 may overlap at least a portion of the first region AR1 and the third region AR3 in the second direction DR2, and overlap the entire second region AR2 in the second direction DR2.

However, exemplary embodiments are not limited thereto. In another exemplary embodiment, the pattern PN1 may overlap only the second region AR2. For example, the width WD4 of the pattern PN1 may be less than or equal to the width WD2 of the second region AR2.

In addition, it is illustrated that the barrier layer MB-4 includes two patterns PN1 disposed on both sides of the substantially flat portion PT2-1, but exemplary embodiments are not limited thereto, and one or three or more patterns PN1 may be disposed according to needs.

FIG. 8A illustrates that the pattern PN1 has a generally semi-circular shape, but the shape is not limited thereto and may be changed, such as generally polygonal shapes or circular shapes.

Figure 8B:
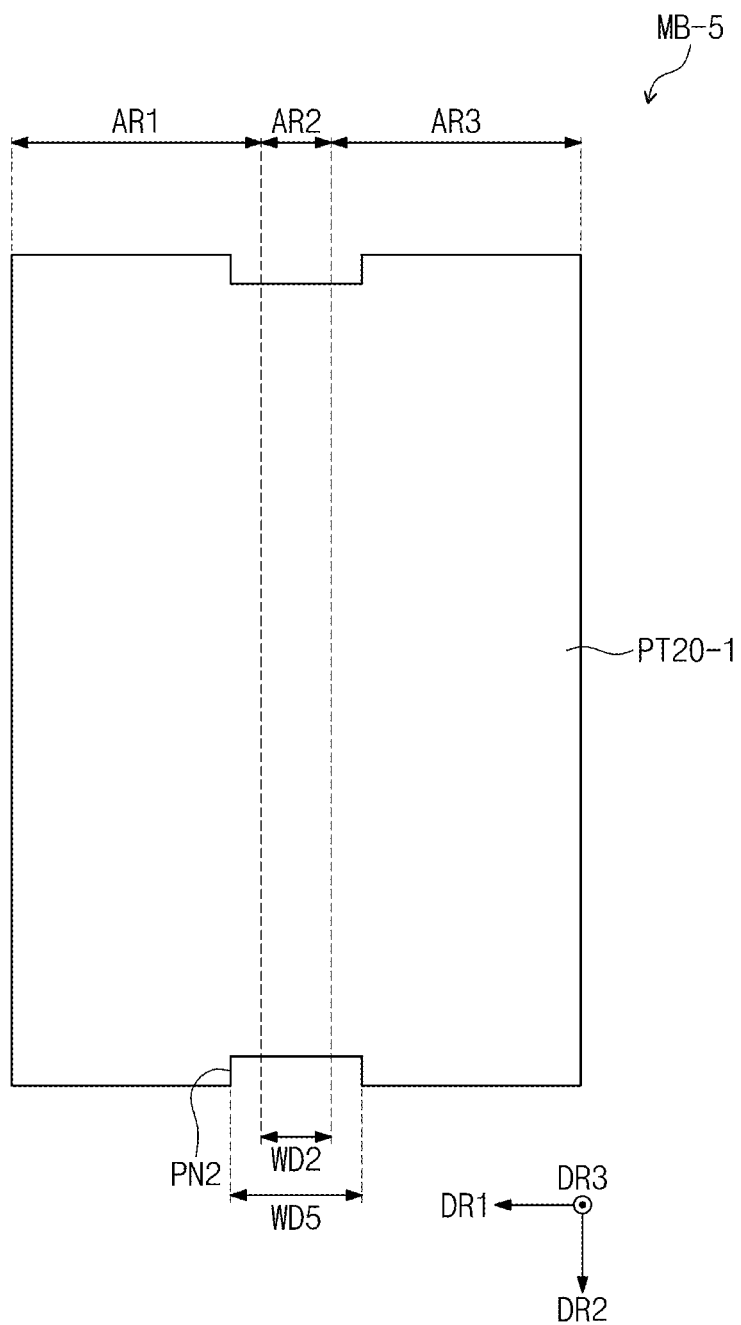
FIG. 8B is a plan view of still another exemplary embodiment of a barrier layer constructed according to the principles of the invention.

FIG. 8B is a plan view of still another exemplary embodiment of a barrier layer constructed according to the principles of the invention.

Referring to FIG. 8B, a barrier layer MB-5 includes a pattern having a generally rectangular shape. The pattern PN2 may have a generally rectangular shape recessed into the substantially flat portion PT20-1.

The width WD5 of the pattern PN2 may be greater than the width WD2 of the second region AR2. The pattern PN2 may overlap the first to third regions AR1, AR2 and AR3 in the second direction DR2. For example, the pattern PN2 may overlap at least a portion of the first region AR1 and the third region AR3 in the second direction DR2, and overlap the entire second region AR2 in the second direction DR2.

However, exemplary embodiments are not limited thereto. In another exemplary embodiment, the pattern PN2 may overlap only the second region AR2. For example, the width WD5 of the pattern PN2 may be less than or equal to the width WD2 of the second region AR2.

In addition, FIG. 8B illustrates that the barrier layer MB-5 includes two patterns PN2 disposed on both sides of the substantially flat portion PT20-1, but exemplary embodiments are not limited thereto, and one or three or more patterns PN2 may be disposed according to needs.

Meanwhile, the description about each of the first region AR1, the second region AR2, the third region AR3, and the protruding portion PT1 may equally applied to each of a first part, a third part, a second part, a fourth part, respectively.

Experimental Example 1

In Table 1 below, barrier layers of example 1, comparative example 1, and comparative example 2 were folded at room temperature and the number of folding operations were counted. Example 1 corresponds to the illustrated embodiments of a barrier layer including one or more protruding portions. Comparative examples 1 and 2 correspond to embodiments having metal thin film barrier layers with generally rectangular shapes that do not include protruding portions.

TABLE 1

| Division | Number of folding operations | Crack occurrence |
|---|---|---|
| Example 1 | 200,000 | No |
| Comparative example 1 | 80,000 | Yes |
| Comparative example 2 | 80,000 | Yes |

The results of Table 1 demonstrate that a crack did not occur in the barrier layer of Example 1 even when folded 200,000 times at room temperature, but a crack occurred in the barrier layers of Comparative examples 1 and 2 when folded 80,000 times at room temperature. In particular, a crack occurred in an edge of the metal thin film foldable region and propagated into the metal thin film. Through Table 1, it may be understood that, since the barrier layer constructed according to the principles and exemplary embodiments of the invention includes a substantially flat portion and protruding portions that extend from the substantially flat portion and has at least a portion overlapping the foldable region, the protruding portions reduce the stress applied to the barrier layer when the barrier layer is folded, and the reliability and/or life span of the display device including the barrier layer is improved.

Experimental Example 2

In Table 2 below, the stress applied to barrier layers when the barrier layers were folded and the number of folding operations at which a crack occurred was measured. Example 2 corresponds to the illustrated embodiments of a barrier layer including protruding portions. Comparative example 3 corresponds to a metal thin film barrier layer having generally rectangular shapes that do not include protruding portions as described herein.

TABLE 2

| Division | Stress (MPa) | Service life (N) |
|---|---|---|
| Example 2 | 1067 | 115,000 |
| Comparative example 3 | 1135 | 80,000 |

Referring to the results of Table 2, the barrier layer of Example 2 had a stress of 1,067 MPa when being folded and a crack occurred when folding the barrier layer 115,000 times. Compared to this, the barrier layer of Comparative example 3 has a stress of 1,135 MPa during folding, and a crack occurred when folding the barrier layer 80,000 times. As such, the barrier layer of Example 2 was subject to less stress than that in Comparative example 3 when being folded, and accordingly the barrier layer of Example 2 was folded significantly more times without the occurrence of the crack than Comparative example 3. That is, the barrier layer of example 2 has service life longer than the barrier layer of comparative example 3. The results summarized in Tables 1 and 2 above are significant and unexpected.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display module having a first non-foldable region, a second non-foldable region, and a foldable region disposed between the first non-foldable region and the second non-foldable region and being foldable about a folding axis extending in a first direction; and
    a barrier layer disposed adjacent the display module and including:
        a first portion having a first region overlapping the first non-foldable region, a second region overlapping the foldable region, and a third region overlapping the second non-foldable region; and
        a second portion extending from at least a portion of the second region of the first portion in the first direction.

2. The display device of claim 1, wherein the barrier layer is foldable about the folding axis overlapping the second region such that the first region and the third region face each other.

3. The display device of claim 2, wherein the second portion overlaps the folding axis.

4. The display device of claim 2, wherein the second portion comprises:
    a first sub portion overlapping the first region in the first direction;
    a second sub portion overlapping the second region in the first direction; and
    a third sub portion overlapping the third region in the first direction,
    wherein the second sub portion overlaps the folding axis.

5. The display device of claim 1, wherein the barrier layer contains at least one of aluminum, copper, nickel, iron, or titanium.

6. The display device of claim 1, wherein the barrier layer has a thickness in a range of about 10-50 μm inclusive.

7. The display device of claim 1, wherein:
    the first portion comprises a substantially flat portion, and the second portion comprises a protruding portion;
    the first to third regions are sequentially defined in the substantially flat portion in a second direction intersecting the first direction; and
    the protruding portion extends from the substantially flat portion in the first direction.

8. The display device of claim 7, wherein the protruding portion has a width in a range of about 3-10 mm inclusive in the second direction.

9. The display device of claim 7, wherein a length by which the protruding portion extends in the first direction from the substantially flat portion is about 100-2,000 μm inclusive.

10. The display device of claim 1, wherein the second portion comprises at least one shape of a semicircular shape or a generally rectangular shape.

11. The display device of claim 1, wherein the second portion comprises:
    a first protruding portion extending from a first side of the first portion; and
    a second protruding portion extending from a second side of the first portion substantially parallel to the first side.

12. The display device of claim 1, further comprising at least one of a cushion layer or a metal plate disposed adjacent the barrier layer.

13. A display device comprising:
- a display module having a first non-foldable region, a foldable region, and a second non-foldable region which are sequentially defined in a first direction; and
- a barrier layer disposed adjacent the display module and having a first region overlapping the first non-foldable region, a second region overlapping the foldable region, and a third region overlapping the second non-foldable region,
- wherein the barrier layer comprises a first portion overlapping the display module, and a second portion extending from the first portion in a second direction intersecting the first direction and at least partially overlapping the second region.

14. The display device of claim 13, wherein the barrier layer contains at least one of aluminum, nickel, copper, iron, or titanium.

15. The display device of claim 13, wherein:
- the first non-foldable region, the foldable region, the second non-foldable region, and each of the first to third regions extend in the second direction intersecting the first direction; and
- the display module has a length greater than a length of the barrier layer in the second direction.

16. The display device of claim 15, wherein the second portion is foldable about a folding axis extending in the second direction.

17. The display device of claim 16, wherein the second portion comprises a protruding portion including:
- a first sub portion overlapping the first region;
- a second sub portion overlapping the second region; and
- a third sub portion overlapping the third region,
- wherein the second sub portion overlaps the folding axis.

18. The display device of claim 13, wherein a length by which the second portion protrudes in the second direction from the first portion is about 100-2,000 μm inclusive.

19. The display device of claim 13, wherein the barrier layer has a thickness in a range of about 10-50 μm inclusive.

20. A display device comprising:
- a substrate having a first substrate region, a second substrate region, and a third substrate region, the third substrate region being disposed between the first substrate region and the second substrate region and overlapping a folding axis; and
- a barrier layer disposed adjacent the substrate and comprising a first part overlapping the first substrate region, a second part overlapping the second substrate region, and a third part overlapping the third substrate region, wherein:
- the first substrate region, the third substrate region, and the second substrate region are defined on the substrate in a first direction;
- the folding axis extends in a second direction intersecting the first direction;
- the barrier layer further comprises a fourth part extending in the second direction from at least one side of the third part; and
- at least a portion of the fourth part overlaps the second part in the second direction.

* * * * *